(12) United States Patent
Montena

(10) Patent No.: US 8,545,235 B2
(45) Date of Patent: Oct. 1, 2013

(54) TORQUE TRANSMITTING HOUSING FOR CATV FILTER

(75) Inventor: Noah Montena, Syracuse, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 965 days.

(21) Appl. No.: 11/467,247

(22) Filed: Aug. 25, 2006

(65) Prior Publication Data

US 2008/0050936 A1    Feb. 28, 2008

(51) Int. Cl.
*H01R 12/00* (2006.01)

(52) U.S. Cl.
USPC ............................................. 439/63

(58) Field of Classification Search
USPC ............ 439/63, 620.03, 620.22, 76.1, 578, 439/339, 133, 620.02; 333/185
See application file for complete search history.

(56) References Cited

U.S. PATENT DOCUMENTS

| 2,777,998 | A | * | 1/1957 | Shepherd ................... 333/167 |
| 4,701,726 | A | * | 10/1987 | Holdsworth ................. 333/185 |
| 4,773,880 | A | * | 9/1988 | Sutton et al. ............ 439/620.09 |
| 5,150,087 | A | | 9/1992 | Yoshie et al. |
| 5,432,488 | A | | 7/1995 | Kotani et al. |
| 5,662,494 | A | | 9/1997 | Zennamo, Jr. et al. |
| 6,273,766 | B1 | | 8/2001 | Zennamo, Jr. et al. |
| 6,636,129 | B2 | | 10/2003 | Zennamo, Jr. et al. |
| 6,737,925 | B1 | * | 5/2004 | Logue et al. .................. 331/2 |
| 6,829,813 | B2 | | 12/2004 | Zennamo, Jr. et al. |
| 6,888,423 | B2 | * | 5/2005 | Tresness et al. ............. 333/185 |
| 6,986,666 | B2 | * | 1/2006 | Benson et al. ................ 439/63 |
| 7,023,298 | B1 | * | 4/2006 | Palinkas et al. ............. 333/185 |

* cited by examiner

*Primary Examiner* — Phuong Dinh
(74) *Attorney, Agent, or Firm* — Hiscock & Barclay, LLP

(57) ABSTRACT

A housing for a CATV filter includes an outer sleeve which is preferably made of stainless steel. A filter assembly and two headers are contained within the outer sleeve. Two engagement holes for a special pin spanner-type wrench are formed in a face of the outer sleeve instead of in a header. The engagement holes are preferably "drifted" holes, which in effect means that rims are created during the forming of holes which add to the strength of the holes.

6 Claims, 3 Drawing Sheets

TORQUE TRANSMITTING HOUSING FOR CATV FILTER

FIELD OF THE INVENTION

This invention relates generally to the field of CATV filters, and more particularly to a torque transmitting housing for a CATV filter.

BACKGROUND OF THE INVENTION

In typical CATV applications, a filter circuit or network is provided to pass signals having frequencies within one or more specified bandwidths, sometimes with a desired amount of signal attenuation, while blocking signals of other frequencies. It is convenient, but not necessary, to mount the electrical components such as capacitors, inductors, and resistors on one or more printed circuit boards in essentially conventional fashion. The circuit board carrying the filter circuit components is mounted within a suitable protective housing. Physical rigidity is required to maintain stable electrical response. Connection headers at each end provide for connecting the filter to a coaxial cable connector and to an equipment port. The entire assembly is commonly referred to as a filter or trap.

It is customary in the CATV industry for system technicians to use special wrenches for the installation and removal of traps. These special wrenches are of the pin spanner type where the driving pins of the wrench are accepted by two shallow holes bored into the end face of one header, sometimes referred to as engagement holes. This has been effective, but requires a degree of manufacturing difficulty and material usage which increases the cost of the trap housing components.

U.S. Pat. No. 5,150,087 (Yoshie et al.); U.S. Pat. No. 5,432,488 (Kotani et al.); U.S. Pat. No. 5,662,494 (Zennamo, Jr. et al.); U.S. Pat. No. 6,273,766 (Zennamo, Jr. et al.); U.S. Pat. No. 6,636,129 (Zennamo, Jr. et al.); U.S. Pat. No. 6,829,813 (Zennamo, Jr. et al.); and U.S. Pat. No. 6,888,423 (Tresness et al.) all show traps with the two engagement holes drilled into the end face of one of the headers.

SUMMARY OF THE INVENTION

Briefly stated, a housing for a CATV filter includes an outer sleeve which is preferably made of stainless steel. A filter assembly and two headers are contained within the outer sleeve. Two engagement holes for a special pin spanner-type wrench are formed in a face of the outer sleeve instead of in a header. The engagement holes are preferably "drifted" holes, which in effect means that rims are created during the forming of holes which add to the strength of the holes.

According to an embodiment of the invention, a housing for a CATV filter includes an outer sleeve; a first end of the sleeve having a first hole therein which is equal in size to an inner diameter of the sleeve; a second end of the sleeve having a face; the face having a centered second hole therein which is sized to permit entry of a threaded cable connector therein; and the face further including two engagement holes therein.

According to an embodiment of the invention, a method for making a housing for a CATV filter includes the steps of (a) forming an outer sleeve, wherein a first end of the sleeve includes a first hole therein which is equal in size to an inner diameter of the sleeve, and wherein a second end of the sleeve includes a face; (b) forming a second hole centered in the face which is sized to permit entry of a threaded cable connector therein; and (c) forming two engagement holes in the face.

DETAILED DESCRIPTION OF THE PREFERRED EMBODIMENT

Figure 1:
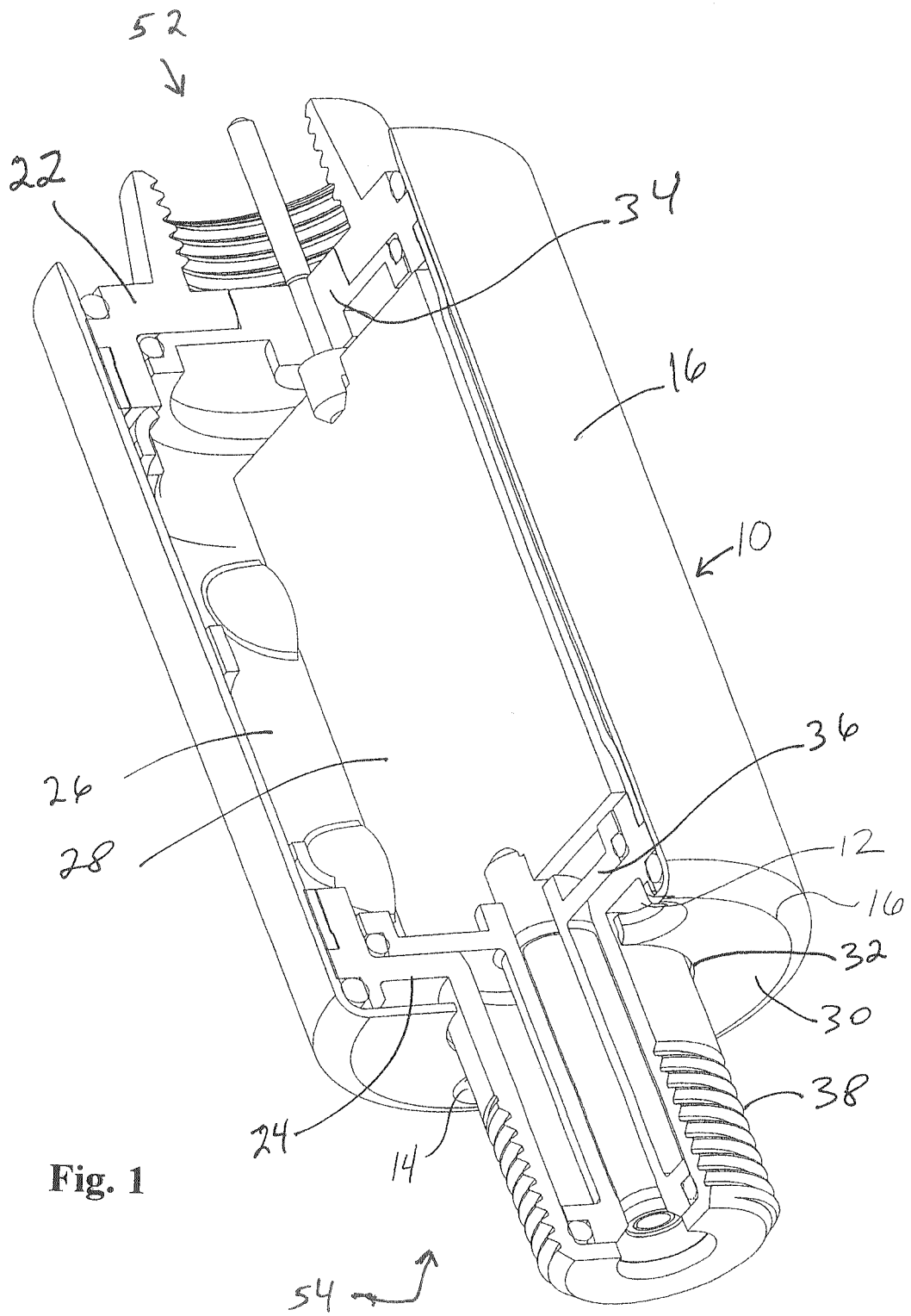
FIG. 1 shows a cutaway perspective view of a filter with a housing according to an embodiment of the present invention.
Figure 2:
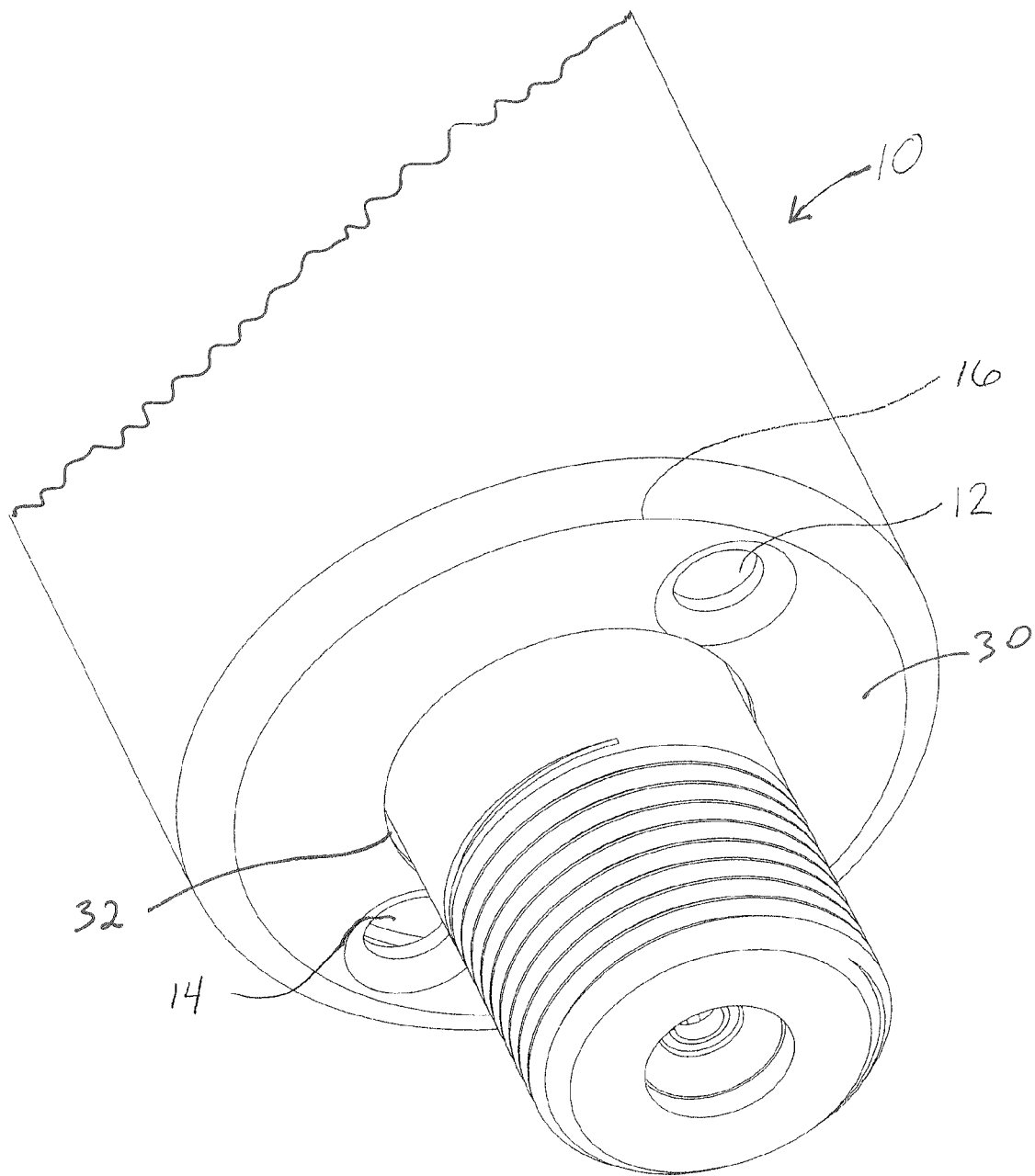
FIG. 2 shows a perspective view of the housing of the embodiment of FIG. 1 with two engagement holes shown.
Figure 3:
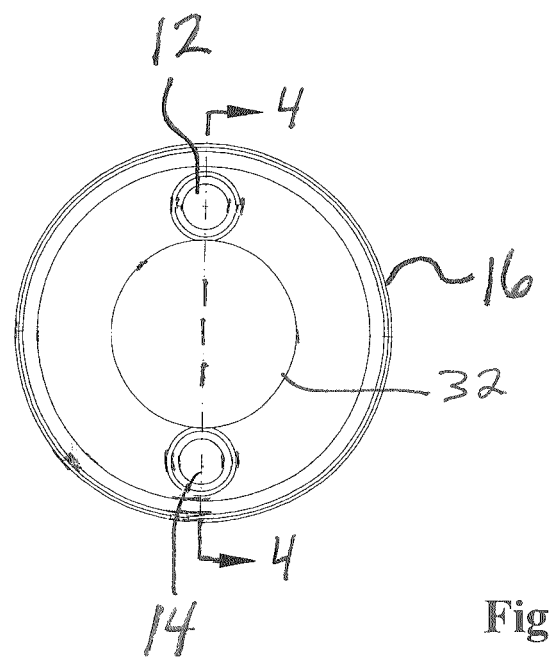
FIG. 3 shows a front elevation view of the embodiment of FIG. 1.
Figure 4:
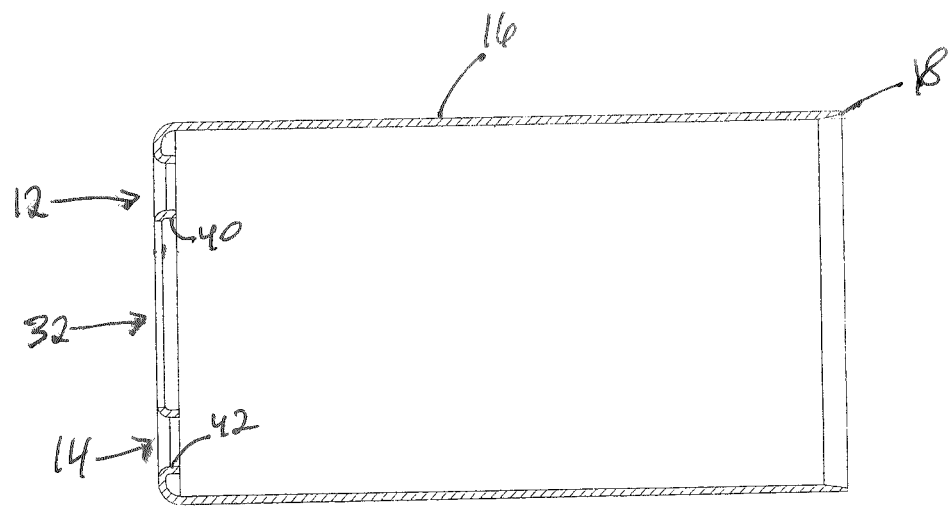
FIG. 4 shows a cross-sectional view taken across line 4-4 of FIG. 3.

Referring to FIGS. 1-4, a CATV filter 10 includes a circuit board 28 connected to an inner frame 26. At a first end 52 of filter 10, an insulator 34 is adjacent to one end of circuit board 28 and is held in place partly by a header 22, while at a second end 54 of filter 10, an insulator 36 is adjacent to another end of circuit board 28 and is held in place partly by a header 24. An outer sleeve, also known as a housing, 16 fits over inner frame 26 and headers 22, 24 holding the assembly together. A portion of header 22 is shaped to connect to an equipment port (not shown), while a portion of header 24 is shaped to connect to a coaxial cable (not shown) via a coaxial cable connector (not shown), and in particular, includes a threaded connector 38.

Outer sleeve 16 includes a central hole 32 in a face 30 to accommodate threaded connector 38. Outer sleeve 16 also includes two engagement holes 12, 14 to accommodate the driving pins (not shown) of the special pin spanner-type wrench (not shown) which is used in the industry to screw filters and traps onto equipment ports. Outer sleeve 16 is preferably of stainless steel, which is comparable to brass in terms of durability. When fabricating outer sleeve 16 of stainless steel, the part is deep drawn, which means that it starts out as steel sheet and is successively stamped into ever deeper and narrower "soup cans" until the final diameter and length are reached. The bottom end is closed, while the top end is still attached all the way around the rim to the parent sheet.

Engagement holes 12, 14 are then formed in face 30 by punching two small holes in the bottom of the partially formed outer sleeve, after which a larger diameter tapered pin is forced through the holes, pushing the edge inward and stretching the diameter of each engagement hole 12, 14 to its final diameter. Central hole 32 is then punched out, after which the part is sheared off the parent sheet and the edge is compacted in an operation known as a "pinch trim" which tapers edge 18 while eliminating the sharp edge left from the shearing. The taper of edge 18 is preferably approximately 15 degrees to aid in fitting outer sleeve 16 over inner frame 26 and headers 22, 24.

Engagement holes 12, 14 are "drifted" holes, meaning that they have curled-in edges 40, 42, respectively, as a result of how they were made. Simply die-punching engagement holes 12, 14 would not add curled edges 40, 42 to engagement holes 12, 14. The strength of the "drifted" edge of the holes, combined with the durability of the stainless steel base metal, makes engagement holes 12, 14 comparable in performance to drilled holes in brass. Curled edges 40, 42 add effective thickness to engagement holes 12, 14 which is greater than the thickness of the sheet metal itself, thus providing structural rigidity to withstand the up to 90 in-lb of torque expected when abused, with minimal deformation of engagement holes 12, 14. Non-drifted holes actually tear under those conditions, whereas the drifted holes merely become slightly egg-shaped. In addition, the prior art method of drilling engagement holes in one header is costlier than the present method of forming engagement holes 12, 14 in outer sleeve 16.

With no engagement holes in the header, machining or casting or metal injection molding without secondary machining operations becomes possible. The material thickness of the header may also be reduced, also saving costs.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A housing for a CATV filter, comprising:
    an outer sleeve;
    a first end of the sleeve having a first hole therein which is equal in size to an inner diameter of the sleeve;
    a second end of the sleeve having a face;
    the face having a centered second hole therein which is sized to permit entry of a threaded cable connector therein; and
    the face further including two engagement holes therein.

2. A housing according to claim 1, wherein the outer sleeve is of stainless steel.

3. A housing according to claim 2, wherein the two engagement holes are drifted.

4. A method for making a housing for a CATV filter, comprising the steps of:
    forming an outer sleeve, wherein a first end of the sleeve includes a first hole therein which is equal in size to an inner diameter of the sleeve, and wherein a second end of the sleeve includes a face;
    forming a second hole centered in the face which is sized to permit entry of a threaded cable connector therein; and
    forming two engagement holes in the face.

5. A method according to claim 4, wherein the outer sleeve is of stainless steel.

6. A method according to claim 5, wherein the two engagement holes are drifted.

* * * * *